(12) United States Patent
Seo

(10) Patent No.: US 7,632,697 B2
(45) Date of Patent: Dec. 15, 2009

(54) NITRIDE SEMICONDUCTOR THIN FILM AND METHOD FOR GROWING THE SAME

(75) Inventor: Jung Hoon Seo, Seoul (KR)

(73) Assignee: LG Electronics Inc., Seoul (KR)

( * ) Notice: Subject to any disclaimer, the term of this patent is extended or adjusted under 35 U.S.C. 154(b) by 569 days.

(21) Appl. No.: 11/484,612

(22) Filed: Jul. 12, 2006

(65) Prior Publication Data

US 2006/0252166 A1    Nov. 9, 2006

Related U.S. Application Data

(62) Division of application No. 11/043,055, filed on Jan. 27, 2005, now Pat. No. 7,122,847.

(30) Foreign Application Priority Data

Jan. 29, 2004    (KR) .................. 10-2004-005563

(51) Int. Cl.
    *H01L 21/00*    (2006.01)
(52) U.S. Cl. .................................... 438/49; 438/94
(58) Field of Classification Search ............ 438/22–48, 438/80–82, 94, E51.01, E51.018
    See application file for complete search history.

(56) References Cited

U.S. PATENT DOCUMENTS

| 2004/0113166 A1 | 6/2004 | Tadatomo et al. ............. 257/98 |
| 2005/0263778 A1* | 12/2005 | Hata et al. .................... 257/79 |

FOREIGN PATENT DOCUMENTS

| JP | 2000-077336 | 3/2000 |
| JP | 2001-168042 | 6/2001 |
| JP | 2001-313259 | 11/2001 |
| JP | 2002-009004 | 1/2002 |
| JP | 2002-110569 | 4/2002 |
| JP | 2003-514392 | 4/2003 |

* cited by examiner

*Primary Examiner*—Cuong Q Nguyen
(74) *Attorney, Agent, or Firm*—KED & Associates, LLP

(57) ABSTRACT

The present invention relates to a nitride semiconductor thin film and a method for growing the same. The present invention has an advantage in that a plurality of grooves are formed on a substrate by partially etching the substrate, and leg portions for preventing longitudinal growth of a nitride semiconductor are formed within the grooves so that the nitride semiconductor thin film is grown laterally to cover top portions of the leg portions, thereby ensuring growth of a high quality nitride semiconductor thin film.

10 Claims, 4 Drawing Sheets

【FIG. 1a】
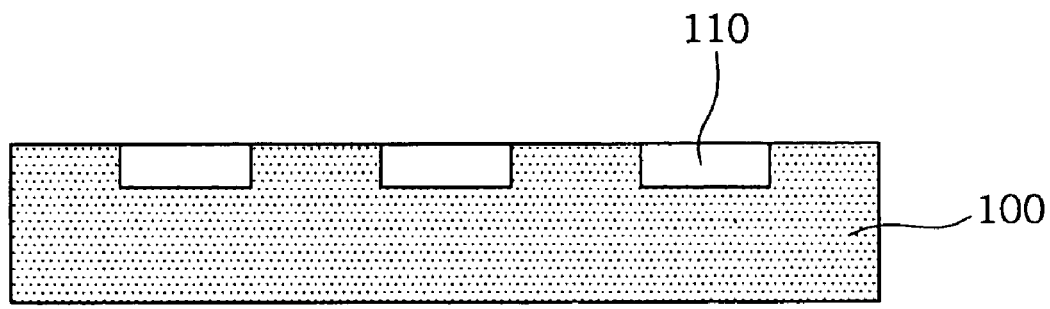
【FIG. 1b】
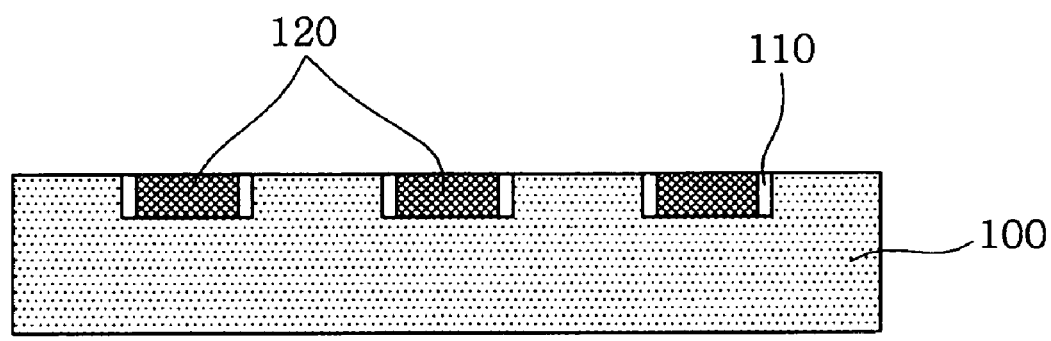

[FIG. 1c]
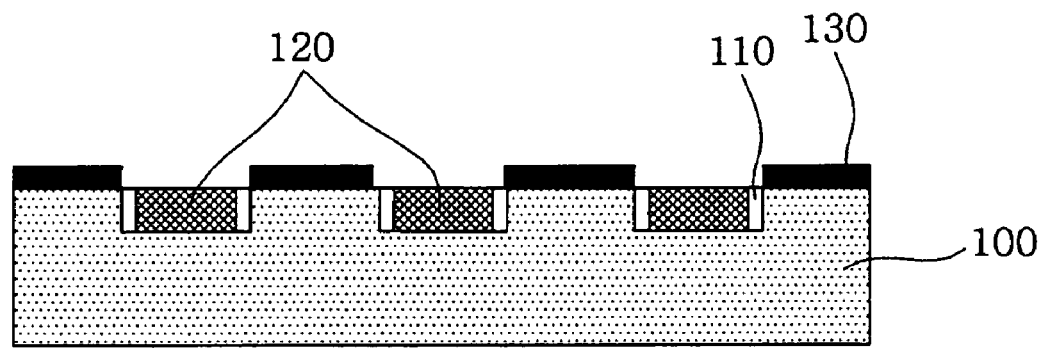
[FIG. 1d]
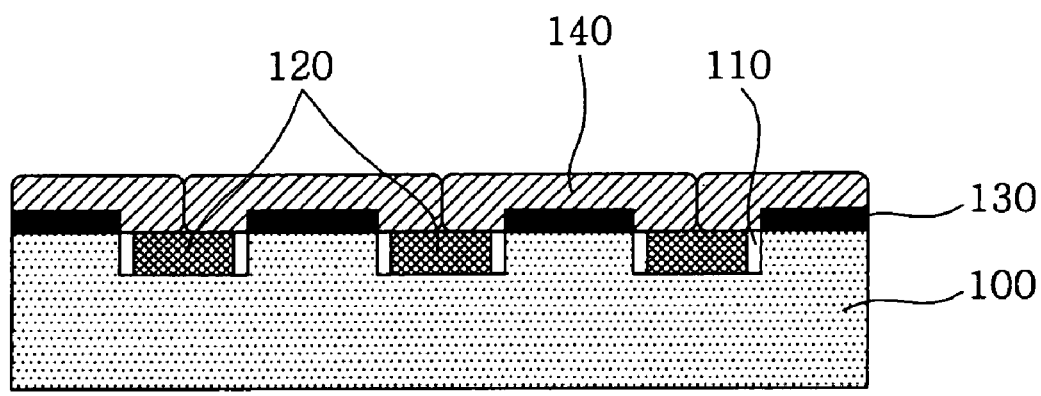

[FIG. 2]
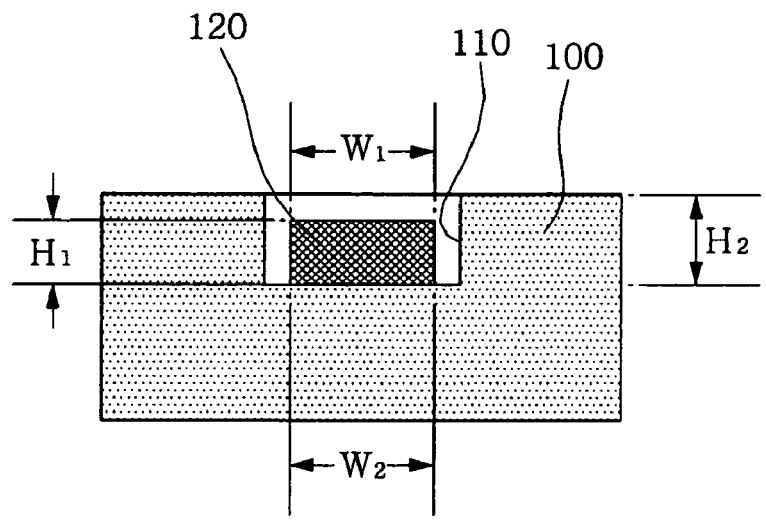
[FIG. 3]
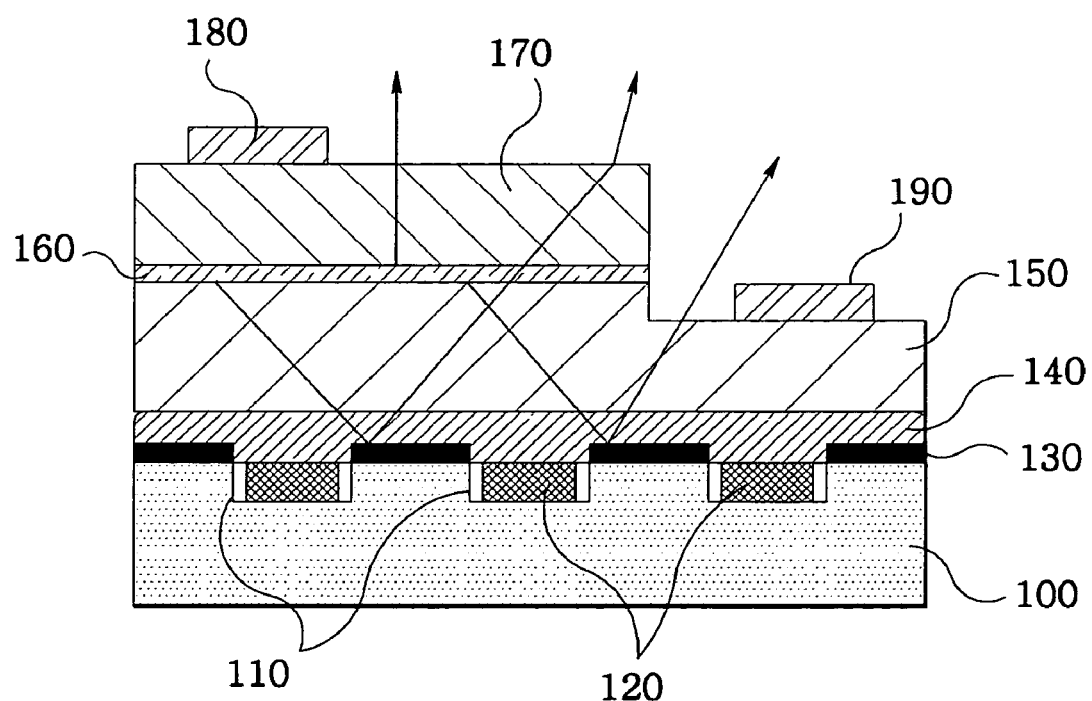

[FIG. 4]
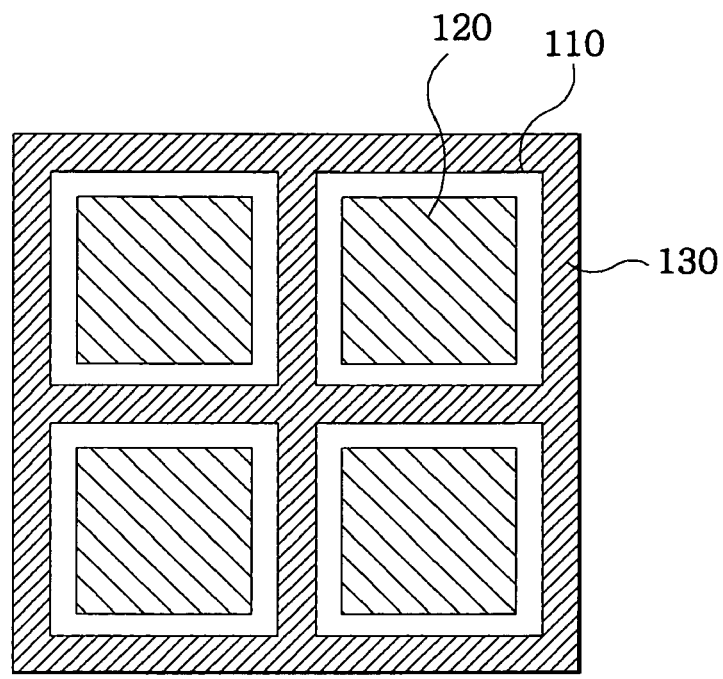
[FIG. 5]
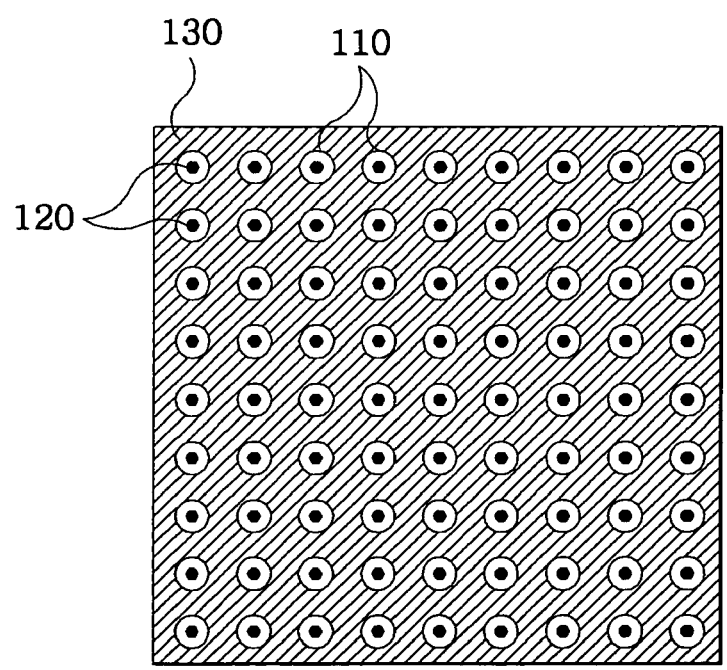

NITRIDE SEMICONDUCTOR THIN FILM AND METHOD FOR GROWING THE SAME

CROSS-REFERENCE TO RELATED APPLICATIONS

This is a Divisional Application of prior application Ser. No. 11/043,055 filed Jan. 27, 2005 now U.S. Pat. No. 7,122,847 whose entire disclosure is incorporated herein by reference. Further, this application claims the benefit of the Korean Application No. 10-2004-005563 filed on Jan. 29, 2004, which is hereby incorporated by reference.

BACKGROUND OF THE INVENTION

1. Field of the Invention

The present invention relates to a nitride semiconductor thin film and a method for growing the same. More particularly, the present invention relates to a nitride semiconductor thin film and a method for growing the same, wherein a plurality of grooves are formed on a substrate by partially etching the substrate, and leg portions for preventing longitudinal growth of a nitride semiconductor are formed within the grooves so that the nitride semiconductor thin film is grown laterally to cover top portions of the leg portions, thereby ensuring growth of a high quality nitride semiconductor thin film.

2. Background of the Related Art

Generally, nitride-based semiconductors are direct transition type semiconductors and have been applied to light emitting elements such as light emitting diodes (LEDs) and laser diodes (LDs). Further, studies on application of the semiconductors to high temperature, high frequency and high electric power electronic devices have actively been conducted. Recently, much more attention has been paid to such semiconductors according to increased demand on light emitting elements.

Such nitride semiconductor thin films are mainly grown on sapphire substrates that are stable in high temperature.

However, since nitride semiconductor thin films and sapphire substrates have large differences in the lattice constants and the coefficients of thermal expansion, there are disadvantages in that a large number of defects such as threading dislocation are produced due to such large differences.

Thus, these defects cause a problem of the degradation of device properties.

Recently, in order to reduce defects in a sapphire substrate and a nitride semiconductor thin film, $Al_xGa_yIn_{1-x-y}N$ ($0 \leq x \leq 1$, $0 \leq y \leq 1$, $0 \leq x+y \leq 1$), SiN, or a stacked film on which these materials are stacked is formed into a buffer layer on a top surface of a sapphire substrate, and a nitride semiconductor thin film is then grown.

In this way, if a nitride semiconductor thin film is grown on the top of a buffer layer, the grown nitride semiconductor thin film has a low threading-dislocation density of 108-109 cm-2, thereby reducing a defect density.

Methods for reducing such threading dislocation include the following: 1) a method in which longitudinal growth and lateral growth are controlled by forming patterns on a sapphire substrate; 2) a lateral epitaxial overgrowth (LEO) method in which a nitride semiconductor thin film is grown on a top surface of a sapphire substrate, a certain pattern of a dielectric film is formed on the top of the nitride semiconductor thin film, and the nitride semiconductor thin film is then grown again; and 3) a Pendeo growth method in which a nitride semiconductor thin film is grown on a top surface of a sapphire substrate, etched in a certain pattern and then grown again.

Meanwhile, in order to fabricate blue violet LDs, or high output, high efficiency and high reliability LEDs, it is required to more reduce a defect density and to develop a method for growing a high quality nitride semiconductor thin film with a remarkably low defect density.

SUMMARY OF THE INVENTION

The present invention is conceived to solve the aforementioned problems. Accordingly, an object of the present invention is to provide a nitride semiconductor thin film and a method for growing the same, wherein a plurality of grooves are formed on a substrate by partially etching the substrate, and leg portions for preventing longitudinal growth of a nitride semiconductor are formed within the grooves so that the nitride semiconductor thin film is grown laterally to cover top portions of the leg portions, thereby ensuring growth of a high quality nitride semiconductor thin film.

According to a preferred aspect of the present invention for achieving the object, there is provided a method for growing a nitride semiconductor thin film, comprising the steps of forming a plurality of grooves in a top surface of a substrate by partially etching the substrate; forming a leg portion for preventing longitudinal growth of a nitride semiconductor within each of the grooves formed in the substrate; forming a buffer layer on portions of the top surface of the substrate where the grooves have not been formed; and growing a nitride semiconductor thin film laterally on the buffer layer to cover the tops of the leg portions.

According to another preferred aspect of the present invention for achieving the object, there is provided a nitride semiconductor thin film, comprising a substrate with a plurality of grooves formed in a top surface thereof; a leg portion formed within each of the grooves to prevent longitudinal growth of a nitride semiconductor; a buffer layer formed on portions of the top surface of the substrate where the grooves have not been formed; and a nitride semiconductor thin film grown laterally on the buffer layer to cover the tops of the leg portions.

BRIEF DESCRIPTION OF THE DRAWINGS

The above and other objects, features and advantages of the present invention will become apparent from the following description of a preferred embodiment given in conjunction with the accompanying drawings, in which:

FIGS. 1a to 1d are views illustrating a process of growing a high quality nitride semiconductor thin film according to the present invention;

FIG. 2 is a sectional view illustrating a relationship between a leg portion and a groove, which is applied to the present invention;

FIG. 3 is a conceptual view illustrating a light-emitting path of a light-emitting element, which is formed in a high quality nitride semiconductor thin film according to the present invention;

FIG. 4 is a plan view illustrating a relationship among the groove, the leg portion and a buffer layer, which are formed on a substrate for growth of the high quality nitride semiconductor thin film according to the present invention; and FIG. 5 is a plan view showing a state where grooves, leg portions and a buffer layer are formed on a substrate according to the present invention.

DETAILED DESCRIPTION OF PREFERRED EMBODIMENTS

Hereinafter, a preferred embodiment of the present invention will be described in detail with reference to the accompanying drawings.

FIGS. 1a to 1d are views illustrating a process of growing a high quality nitride semiconductor thin film according to the present invention. First, a plurality of grooves 110 are formed in a top surface of a sapphire substrate 100 by partially etching the sapphire substrate 100 (FIG. 1a).

Here, the top surface of the sapphire substrate 100 has a corrugated shape.

Thereafter, a leg portion 120 for preventing longitudinal growth of a nitride semiconductor is formed within each of the grooves 110 formed in the sapphire substrate 100 (FIG. 1b).

At this time, the leg portion 120 is constructed of an oxide film or nitride film such as SiO2, Si3N4, TiOx or ZrOx, or a multi-layered film comprising such oxide and nitride films.

Further, the leg portion 120 is constructed of a film made of one selected from the group comprising Ag, Al, Rh, Pt and Pd, or a multi-layered film thereof.

If the leg portions 120 are made of metal in such a manner and a light-emitting element is then fabricated using a nitride semiconductor film with the leg portions, the reflectance of light emitted from an active layer can be increased, thereby enhancing the optical efficiency of the element.

Next, a buffer layer 130 is formed on portions of the top surface of the sapphire substrate 100 where the grooves 110 have not been formed (FIG. 1c).

Here, the buffer layer 130 is made of one selected from the group comprising AlN, GaN and AlInN.

Finally, a nitride semiconductor thin film 140 is grown laterally on the buffer layer 130 to cover the tops of the leg portions 120 (FIG. 1d).

Therefore, according to the present invention, the grooves and the leg portions intercept dislocation generated at an interface between the sapphire substrate and the grown nitride semiconductor thin film, thereby ensuring growth of a high quality nitride semiconductor thin film.

Meanwhile, the aforementioned sapphire substrate is only for illustrative purposes, and the substrate with the grooves formed therein refers to all kinds of substrates for use in fabricating light-emitting elements. Particularly, it is preferred that the substrate be one of a sapphire substrate, a GaN substrate, a silicone carbide (SiC) substrate and a gallium arsenide (GaAs) substrate.

FIG. 2 is a sectional view illustrating a relationship between a leg portion and a groove, which is applied to the present invention. It is preferred that the width W1 of the leg portion 120, which exists within each of the grooves 110 formed in the top surface of the sapphire substrate 100, be 1 to 100% of the width W2 of each of the grooves 110. Further, it is preferred that the height H1 from an inner bottom surface of each of the grooves 110 to the top surface of the leg portion 120 be 1 to 100% of the height H2 from the inner bottom surface of each of the grooves 110 to the top surface of the sapphire substrate 100.

FIG. 3 is a conceptual view illustrating a light-emitting path of a light-emitting element, which is formed in a high quality nitride semiconductor thin film according to the present invention. First, the nitride semiconductor thin film formed by performing the aforementioned process illustrated in FIGS. 1a to 1d comprises the substrate 100 with the plurality of grooves 110 formed in a top surface thereof; the leg portion 120 formed within each of the grooves 110 to prevent longitudinal growth of the nitride semiconductor; the buffer layer 130 formed on portions of the top surface of the substrate 100 where the grooves 110 have not been formed; and the nitride semiconductor thin film 140 grown laterally on the buffer layer 130 to cover the tops of the leg portions 120.

It is possible to fabricate a light-emitting element, wherein an N-type semiconductor layer 150, an active layer 160 and a P-type semiconductor layer 170 are sequentially stacked on the top of such a nitride semiconductor thin film, mesa etching is performed from the P-type semiconductor layer 170 to a portion of the N-type semiconductor layer 150, an N electrode 190 is formed on the top of the mesa-etched portion of the N-type semiconductor layer 150, and a P electrode 180 is formed on the top of the P-type semiconductor layer 170.

If the light-emitting element is driven, light emitted from the active layer 160 is transmitted through the P-type semiconductor layer 170 and then emitted outside the element.

At this time, since light is emitted from the active layer 160 in all directions, light with a light-emitting path toward the surface of the substrate undergoes total reflection at an interface between a substrate and an N-type semiconductor layer in a conventional substrate, so that the light is confined within the element, resulting in lowered optical output.

However, if a light-emitting element is fabricated using the nitride semiconductor thin film according to the present invention, corrugation is formed in the interface between the substrate and the N-type semiconductor layer as shown in FIG. 3, so that the amount of light totally reflected can be reduced, thereby enhancing optical output.

Further, when the leg portions 120 formed within the grooves of the substrate are metallic, they can reflect light that proceeds toward the substrate, thereby enhancing optical output.

FIG. 4 is a plan view illustrating a relationship among the groove, the leg portion and the buffer layer, which are formed on the substrate for growth of the high quality nitride semiconductor thin film according to the present invention. The leg portions 120 are formed within the plurality of grooves 110 formed in the substrate and the buffer layer 130 is formed on the surface of the substrate.

It is preferred that the total area of the buffer layer 130 be larger than that of the grooves 110. If the total area of the buffer layer 130 is larger than that of the grooves 110, the nitride semiconductor thin film to be grown on the buffer layer 130 is laterally grown, thereby facilitating coalescence of the nitride semiconductor thin film over the leg portions.

FIG. 5 is a plan view showing a state where grooves, leg portions and a buffer layer are formed on a substrate according to the present invention. If a great number of grooves 110 are formed in a substrate, leg portions 120 exist within these grooves 110. Consequently, many corrugations are formed in the top surface of the substrate so that a light-emitting element fabricated using this substrate can further reduce total reflection, thereby more enhancing optical output.

As described above, the present invention has an advantage in that a plurality of grooves are formed on a sapphire substrate by partially etching the substrate, and leg portions for preventing longitudinal growth of a nitride semiconductor are formed within the grooves so that the nitride semiconductor thin film is grown laterally to cover top portions of the leg portions, thereby ensuring growth of a high quality nitride semiconductor thin film.

Although the present invention has been described in connection with the specific embodiment, it will be readily understood by those skilled in the art that various modifications and changes can be made thereto within the technical spirit and scope of the present invention. It is also apparent that the modifications and changes fall within the scope of the present invention defined by the appended claims.

What is claimed is:

1. A method for growing a nitride semiconductor thin film, comprising:
   forming a plurality of grooves in a top surface of a substrate by partially etching the substrate;
   forming a leg portion for preventing longitudinal growth of a nitride semiconductor within each of the grooves formed in the substrate;
   forming a buffer layer on portions of the top surface of the substrate where the grooves have not been formed; and
   growing a nitride semiconductor thin film laterally on the buffer layer to cover the tops of the leg portions, wherein the buffer layer is made of any one of AlN, GaN and AlInN.

2. The method as claimed in claim 1, wherein the leg portion is constructed of a film made of one selected from the group comprising $SiO_2$, $Si_3N_4$, $TiO_x$ and $ZrO_x$, or a stacked film thereof.

3. The method as claimed in claim 1, wherein the leg portion is constructed of a film made of one selected from the group comprising Ag, Al, Rh, Pt and Pd, or a multi-layered film thereof.

4. The method as claimed in claim 1, wherein the substrate is one of a sapphire substrate, a GaN substrate, a silicone carbide (SiC) substrate and a gallium arsenide (GaAs) substrate.

5. The method as claimed in claim 1, wherein a width (W1) of the leg portion, which exists within each of the grooves formed in the top surface of the substrate, is 1 to 100% of a width (W2) of each of the grooves.

6. The method as claimed in claim 1, wherein a height (H1) from an inner bottom surface of each of the grooves to the top of the leg portion is 1 to 100% of a height (H2) from the inner bottom surface of each of the grooves to the top surface of the substrate.

7. A method for growing a nitride semiconductor thin film, comprising:
   forming a plurality of grooves in a top surface of a substrate by partially etching the substrate;
   forming a leg portion for preventing longitudinal growth of a nitride semiconductor within each of the grooves formed in the substrate, wherein the leg portion is constructed of a film made of one selected from the group comprising $SiO_2$, $Si_3N_4$, $TiO_x$ and $ZrO_x$, or a stacked film thereof;
   forming a buffer layer on portions of the top surface of the substrate where the grooves have not been formed; and
   growing a nitride semiconductor thin film laterally on the buffer layer to cover the tops of the leg portions.

8. The method as claimed in claim 7, wherein the substrate is one of a sapphire substrate, a GaN substrate, a silicone carbide (SiC) substrate and a gallium arsenide (GaAs) substrate.

9. The method as claimed in claim 7, wherein a width of the leg portion, which exists within each of the grooves formed in the top surface of the substrate, is 1 to 100% of a width of each of the grooves.

10. The method as claimed in claim 7, wherein a height from an inner bottom surface of each of the grooves to the top of the leg portion is 1 to 100% of a height from the inner bottom surface of each of the grooves to the top surface of the substrate.

* * * * *